US008049544B2

(12) United States Patent
Hong et al.

(10) Patent No.: US 8,049,544 B2
(45) Date of Patent: Nov. 1, 2011

(54) DELAY LOCKED LOOP CIRCUIT

(75) Inventors: Nam-Pyo Hong, Gyeonggi-do (KR); Jin-Youp Cha, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 187 days.

(21) Appl. No.: 12/627,179

(22) Filed: Nov. 30, 2009

(65) Prior Publication Data

US 2011/0001526 A1 Jan. 6, 2011

(30) Foreign Application Priority Data

Jul. 1, 2009 (KR) ........................ 10-2009-0059721

(51) Int. Cl.
*H03L 7/06* (2006.01)
(52) U.S. Cl. ........................ 327/158; 327/149
(58) Field of Classification Search .................. 327/149, 327/158
See application file for complete search history.

(56) References Cited

U.S. PATENT DOCUMENTS

| 7,737,745 | B2 * | 6/2010 | You | 327/158 |
| 2008/0054947 | A1 * | 3/2008 | Choi | 327/12 |
| 2008/0136476 | A1 * | 6/2008 | Ku | 327/158 |
| 2008/0191757 | A1 * | 8/2008 | Choi | 327/149 |
| 2009/0045857 | A1 * | 2/2009 | Kim | 327/158 |
| 2009/0115475 | A1 * | 5/2009 | Oh | 327/158 |
| 2010/0073053 | A1 * | 3/2010 | Shin | 327/158 |
| 2010/0195423 | A1 * | 8/2010 | Oh | 365/194 |
| 2010/0271087 | A1 * | 10/2010 | Choi | 327/149 |
| 2011/0001526 | A1 * | 1/2011 | Hong et al. | 327/158 |
| 2011/0050304 | A1 * | 3/2011 | Kuroki et al. | 327/158 |
| 2011/0074479 | A1 * | 3/2011 | Yun et al. | 327/158 |

* cited by examiner

*Primary Examiner* — Lincoln Donovan
*Assistant Examiner* — Adam Houston
(74) *Attorney, Agent, or Firm* — IP & T Group LLP

(57) ABSTRACT

A delay locked loop circuit includes a phase comparison unit configured to compare a reference clock with a feedback clock and to output a phase comparison signal, a clock delay unit configured to delay a first reference clock in response to the phase comparison signal, to output a first delay locked clock, to delay one of the first delay locked clock and a second reference clock according to a frequency information signal, and to output a second delay locked clock, a delay locked clock generating unit configured to output a delay locked clock as a phase-mixed clock of the first delay locked clock and the second delay locked clock, the first delay locked clock, or the second delay locked clock in response to the frequency information signal and a delay transfer signal, and a delay replica model unit configured to reflect a delay condition of the reference clock.

31 Claims, 2 Drawing Sheets

DELAY LOCKED LOOP CIRCUIT

CROSS-REFERENCE TO RELATED APPLICATIONS

The present application claims priority of Korean Patent Application No. 10-2009-0059721, filed on Jul. 1, 2009, which is incorporated herein by reference in its entirety.

BACKGROUND OF THE INVENTION

Exemplary embodiments of the present invention relate to a semiconductor device, and more particularly, to a delay locked loop circuit for a semiconductor device.

A synchronous semiconductor device, including a double data rate synchronous dynamic random access memory (DDR SDRAM), transfers data to external devices using an internal clock synchronized with an external clock inputted from an external device.

It is important to synchronize data outputted from a memory cell with an external clock provided by a memory controller to the memory cell in order to stably transfer data between the memory cell and the memory controller.

Herein, the data outputted from the memory cell is synchronized with the internal clock and is outputted. The internal clock is applied to be synchronized with the external clock when the internal clock is applied to the memory cell. However, the internal clock is not synchronized with the external clock when the internal clock is outputted to outside the memory cell because the internal clock is delayed when passing through internal elements of the memory cell.

Accordingly, in order to compensate for the delay and to stably transfer the data outputted from the memory cell, the internal clock should be synchronized with the external clock by adjusting a bus-loading time of the data to correctly align a delayed internal clock with an edge or a center of the external clock. The bus-loading time of the data represents the time for loading data on the bus.

A phase locked loop (PLL) circuit and a delayed locked loop (DLL) are used in a clock synchronization circuit for performing the operation described above.

If a frequency of the external clock and a frequency of the internal clock are different from each other, the PLL is used as the clock synchronization circuit because a frequency dividing function is requested. But, if a frequency of the external clock is identical to a frequency of the internal clock, the DLL is used as the clock synchronization circuit because the DLL is implemented in a smaller area than the PLL and is not as sensitive to a noise as the PLL.

Because the semiconductor device uses the same frequency, the DLL is widely used as the clock synchronization circuit.

In particular, a register controlled DLL is most widely used in the semiconductor device.

The register controlled DLL has a register for storing a locked delay value. The register controlled DLL performs a clock synchronization operation at a relatively small phase difference between the internal clock and the external clock in an initial operation of a semiconductor device by storing the locked delay value in the register when a power is switched off, and by loading the locked delay value stored in the register to lock the internal clock when the power is applied to the memory device. After the initial operation of the semiconductor device, the register controlled DLL may decrease a time consumed in the synchronization of the internal clock and the external clock by adjusting a variation width of the locked delay value of the register based on a phase difference between the internal clock and the external clock.

FIG. 1 is a block diagram illustrating a register controlled DLL circuit in accordance with a conventional semiconductor device.

As shown in FIG. 1, a register controlled DLL circuit in accordance with a conventional semiconductor device includes a clock buffering unit 180, a phase comparison unit 100, a clock delay unit 120, a delay locked clock generating unit 140 and a delay replica model unit 160.

The clock buffering unit 180 receives an external clock CLK and an inverted clock CLK# of the external clock (hereinafter, referred to as an inverted external clock CLK#) inputted from an external device. The clock buffering unit 180 outputs a reference clock REFCLK to the phase comparison unit 100, and outputs a first reference clock REFCLK_F and a second reference clock REFCLK_R to the clock delay unit 120.

The clock comparison unit 100 receives the reference clock REFCLK and a feedback clock FBCLK, compares the reference clock REFCLK with the feedback clock FBCLK, and generates first and second delay control signals DLY_LOCK_CRL_F and DLY_LOCK_CRL_R.

The clock comparison unit 100 includes a clock phase comparison block 102 and a delay control signal generating block 104.

The clock phase comparison block 102 compares a phase of the reference clock REFCLK with a phase of the feedback clock FBCLK and generates a clock comparison signal PHASE_COMP.

The delay control signal generating block 104 generates the first delay control signal DLY_LOCK_CRL_F for controlling a delay operation of to a first clock delay block 122 of the clock delay unit 120 in response to the clock phase comparison signal PHASE_COMP, and generates the second delay control signal DLY_LOCK_CRL_R for controlling a delay operation of a second clock delay block 124 of the clock delay unit 120 in response to the clock phase comparison signal PHASE_COMP.

The clock delay unit 120 delays the first and second reference clocks REFCLK_F and REFCLK_R corresponding to first and second edges (e.g., a falling edge and a rising edge) of the reference clock in response to the first and second delay control signals DLY_LOCK_CRL_F and DLY_LOCK_CRL_R, respectively, and outputs first and second delay locked clocks DLLCLK_F and DLLCLK_R as delayed clocks of the first and second reference clocks REFCLK_F and REFCLK_R, respectively.

The clock delay unit 120 includes the first clock delay block 122 and the second clock delay block 124.

The first clock delay block 122 delays the first reference clock REFCLK_F by a delay amount corresponding to the first delay control signal DLY_LOCK_CRL_F outputted from the phase comparison unit 100, and outputs the first delay locked clock DLLCLK_F as the delayed clock of the first reference clock REFCLK_F.

The second clock delay block 124 delays the second reference clock REFCLK_R by a delay amount corresponding to the second delay control signal DLY_LOCK_CRL_R outputted from the phase comparison unit 100, and outputs the second delay locked clock DLLCLK_R as the delayed clock of the second reference clock REFCLK_R.

The delay locked clock generating unit 140 mixes a phase of the first delay locked clock DLLCLK_F and a phase of the second delay locked clock DLLCLK_R, and outputs a delay locked clock DLLCLK as a phase-mixed clock of the first and second delay locked clock DLLCLK_F and DLLCLK_R.

The delay replica model unit 160 reflects a delay time of a real output path of the reference clock REFCLK on the delay locked clock DLLCLK, and outputs the feedback clock FBCLK.

A basic locking operation of the register controlled DLL circuit in accordance with the conventional semiconductor device is described immediately below.

The first delay locked clock DLLCLK_F and the second delay locked clock DLLCLK_R are outputted by delaying the first reference clock REFCLK_F corresponding to a first edge of the reference clock REFCLK and the second reference clock REFCLK_R corresponding to a second edge of the reference clock REFCLK, respectively, in order to synchronize a rising edge of the reference clock REFCLK with a rising edge of the feedback clock FBCLK having a different phase before the locking state.

Herein, a phase of the first delay locked clock DLLCLK_F is mixed with a phase of the second delay locked clock DLLCLK_R to generate a delay locked clock DLLCLK. A real delay condition of the reference clock REFCLK is reflected on the delay locked clock DLLCLK, and the feedback clock FBCLK is outputted. As a phase delay amount of the first reference clock REFCLK_F and the second reference clock REFCLK_R increases, a phase difference between the reference clock REFCLK and the feedback clock FBCLK decreases.

Meanwhile, the clock delay unit 120 described above is configured to prevent a distortion of a duty ratio of the delay locked clock DLLCLK outputted from a DLL circuit.

In the case of an external clock CLK and an inverted external clock CLK# inputted from an external device, a distorted duty ratio may be inputted and a delay locked clock DLLCLK may have the distorted duty ratio when a delay locked operation is simply performed with the external clock CLK and the inverted external clock CLK#.

However, distortion of the duty ratio of the delay locked clock DLLCLK outputted from the DLL circuit is prevented by the DLL circuit as shown in FIG. 1.

When the external clock CLK and the inverted external clock CLK# have high frequencies, the duty ratio correction operation is requested. However, when the external clock CLK and the inverted external clock CLK# have low frequencies, the duty ratio correction operation is not requested.

That is, when the external clock CLK and the inverted external clock CLK# have high frequencies, the distortion of the duty ratio may cause a large jitter because one period of a clock is very short. However, when the external clock CLK and the inverted external clock CLK# have low frequencies, the distortion of the duty ratio may cause little jitter because one period of a clock is very long.

Further, when the external clock CLK and the inverted external clock CLK# have high frequencies, a delay amount of a clock delay unit, compensated according to a phase difference between the reference clock REFCLK and the feedback clock FBCLK, is very short because one period of a clock is very short. However, when the external clock CLK and the inverted external clock CLK# have low frequencies, a delay amount of a clock delay unit, compensated according to a phase difference between the reference clock REFCLK and the feedback clock FBCLK, is very long because one period of a clock is very long.

Accordingly, because the register controlled DLL circuit in accordance with the conventional semiconductor device performs a duty ratio correction operation irrespective of the frequencies of the external clock CLK and the inverted external clock CLK#, the operation of the register controlled DLL circuit is inefficient, and the clock delay unit must have a large area to generate a large delay amount for outputting the delay locked clock DLLCLK.

SUMMARY OF THE INVENTION

An embodiment of the present invention is directed to a DLL circuit for a semiconductor device, which efficiently and stably operates irrespective of a frequency change of an external clock by changing a delay manner according to a frequency of an external clock.

In accordance with an embodiment of the present invention, a delay locked loop circuit includes a phase comparison unit configured to compare a reference clock with a feedback clock and to output a phase comparison signal, a clock delay unit configured to delay a first reference clock in response to the phase comparison signal, to output a first delay locked clock, to delay one of the first delay locked clock and a second reference clock according to a frequency information signal, and to output a second delay locked clock, a delay locked clock generating unit configured to output a delay locked clock as a phase-mixed clock of the first delay locked clock and the second delay locked clock, the first delay locked clock, or the second delay locked clock in response to the frequency information signal and a delay transfer signal, and a delay replica model unit configured to reflect a delay condition of the reference clock on the delay locked clock and to output the feedback clock.

The first reference clock may correspond to a first edge of the reference clock, the second reference clock may correspond to a second edge of the reference clock, and the delay transfer signal is activated when a delay amount reaches a limited delay amount.

The phase comparison unit may include a clock phase comparison block configured to compare a phase of the reference clock and a phase of the feedback clock, and generate the phase comparison signal of which a logic level is determined based upon a comparison result, and a delay control signal generating block configured to classify the phase comparison signal at a predetermined period using a predetermined pattern, and to output a first delay control signal and a second delay control signal.

The clock phase comparison block may compare the phase of the reference clock with the phase of the feedback clock, output the phase comparison signal in an inactive state if the reference clock leads the feedback clock, and output the phase comparison signal in an active state if the feedback clock leads the reference clock.

The delay control signal generating block may output the first delay control signal as the phase comparison signal classified at a predetermined odd period from a start point of a phase comparison, and output the second delay control signal as the phase comparison signal classified at a predetermined even period from the start point of the phase comparison.

In case of a high frequency operating mode corresponding to the frequency information signal, the clock delay unit may increase a delay amount of the first reference clock, output the first delay locked clock by increasing a delay amount of a first delay line in response to an active state of the first delay control signal, decrease a delay amount of the first reference clock and output the first delay locked clock by decreasing the delay amount of the first delay line in response to an inactive state of the first delay control signal.

In case of a low frequency operating mode corresponding to the frequency information signal, the clock delay unit may increase the delay amount of the first reference clock, output the first delay locked clock by increasing the delay amount of the first delay line in response to an active state of the phase comparison signal, decrease the delay amount of the first reference clock, and output the first delay locked clock by decreasing the delay amount of the first delay line in response to an inactive state of the phase comparison signal.

In case of a high frequency operating mode corresponding to the frequency information signal, the clock delay unit may increase a delay amount of the second reference clock, output the second delay locked clock by increasing a delay amount of a second delay line in response to an active state of the second delay control signal, decrease the delay amount of the second reference clock, and output the second delay locked clock by decreasing the delay amount of the second delay line in response to an inactive state of the second delay control signal.

In case of a low frequency operating mode corresponding to the frequency information signal, after the delay transfer signal is activated when the delay amount of the first delay line reaches a limited delay amount, the clock delay unit may increase a delay amount of the first delay locked clock, output the second delay locked clock by increasing the delay amount of the second delay line in response to an active state of the phase comparison signal, decrease the delay amount of the first delay locked clock, and output the second delay locked clock by decreasing the delay amount of the second delay line in response to an inactive state of the phase comparison signal.

In case of a high frequency operating mode corresponding to the frequency information signal, the delay locked clock generating unit may output the delay locked clock as a phase-mixed clock of the first delay locked clock and the second delay locked clock irrespective of a logic level of the delay transfer signal.

In case of a low frequency operating mode corresponding to the frequency information signal, the delay locked clock generating unit may output the delay locked clock as the first delay locked clock in response to an inactive state of the delay transfer signal when the delay amount of the first delay line does not reach the limited delay amount, and output the delay locked clock as the second delay locked clock in response to an active state of the delay transfer signal when the delay amount of the first delay line reaches the limited delay amount.

The DLL circuit may further include a buffering unit configured to buffer an external clock and an inverted external clock, and to generate the reference clock, the first reference clock, and the second reference clock.

The DLL circuit may further include a frequency information signal generating unit configured to detect an operating frequency and to generate the frequency information signal of which a logic level is variable depending upon a detection result.

The DLL circuit may further include a frequency information signal input unit configured to receive the frequency information signal of which a logic level is variable depending upon an operating frequency from an external signal.

A logic level of the frequency information signal may be variable depending upon a column latency value determined by a memory register set (MRS).

In accordance with another embodiment of the present invention, a delay locked loop circuit includes a phase comparison unit configured to compare a reference clock with a feedback clock and to output a phase comparison signal, a delay control signal generating unit configured to classify the phase comparison signal at a predetermined period using a predetermined pattern and to output a first delay control signal and a second delay control signal, a first clock delay unit configured to output a first delay locked clock as a delayed clock of a first reference clock in response to the first delay control signal during a high frequency operating mode, to output the first delay locked clock as the delayed clock of the first reference clock in response to the phase comparison signal outputted from the phase comparison unit, and to activate a delay transfer signal in response to a delay amount which reaches a limited delay amount, a second clock delay unit configured to output a second delay locked clock as a delayed clock of a second reference clock in response to the second delay control signal during the high frequency operating mode, and to output the second delay locked clock as one of the first and second delay locked clocks corresponding to the delay transfer signal during the low frequency operating mode, a clock delay unit configured to delay the first reference clock in response to the phase comparison signal, to output the first delay locked clock, to delay one of the first delay locked clock and the second reference clock corresponding to a frequency information signal, and to output the second delay locked clock, a delay locked clock generating unit configured to output a delay locked clock as a phase-mixed clock of the first delay locked clock and the second delay locked clock during a high frequency operating mode and to output the delay locked clock as one of the first delay locked clock and the second delay locked clock during a low frequency operating mode, and a delay replica model unit configured to reflect a delay condition of the reference clock on the delay locked clock and to output the feedback clock.

DESCRIPTION OF SPECIFIC EMBODIMENTS

Figure 1:
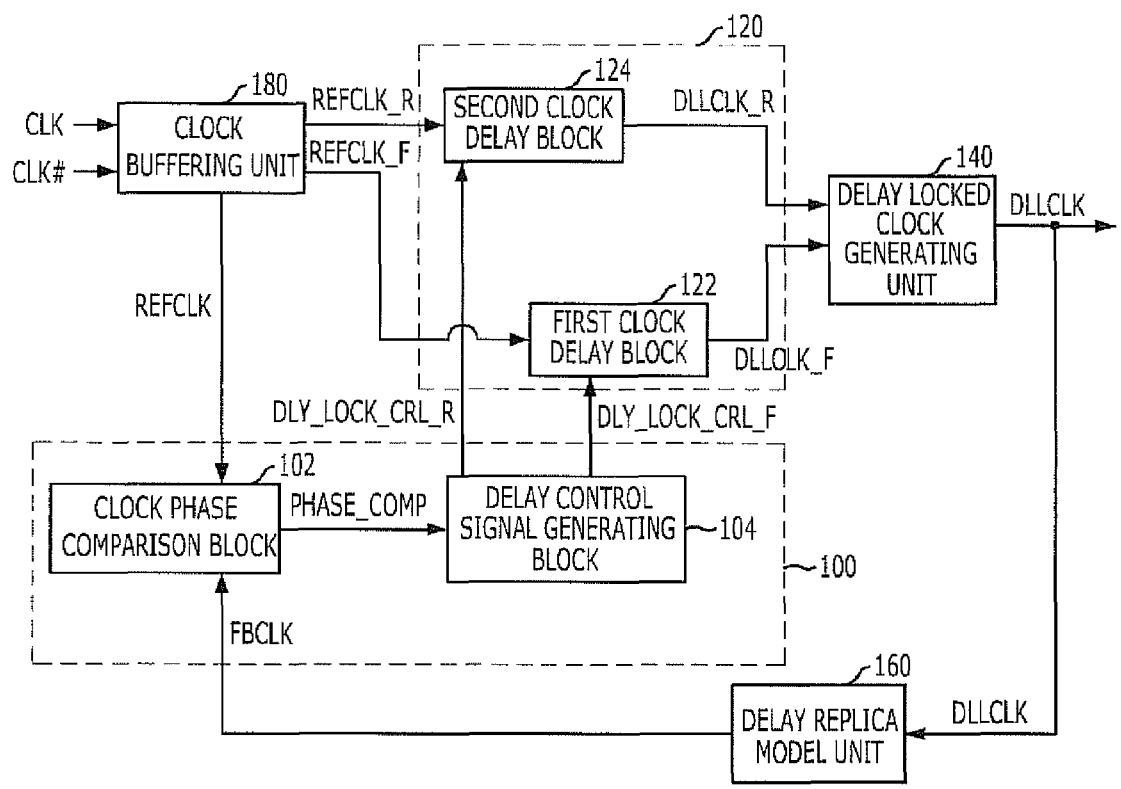
FIG. 1 is a block diagram illustrating a register controlled DLL circuit in accordance with a conventional semiconductor device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this application will be thorough and complete, and will fully convey the scope of the present invention to those skilled in the art. Throughout the application, like reference numerals refer to like parts throughout the various figures and embodiments of the present invention.

The drawings are not necessarily to scale and in some instances, proportions may have been exaggerated in order to clearly illustrate features of the embodiments.

Figure 2:
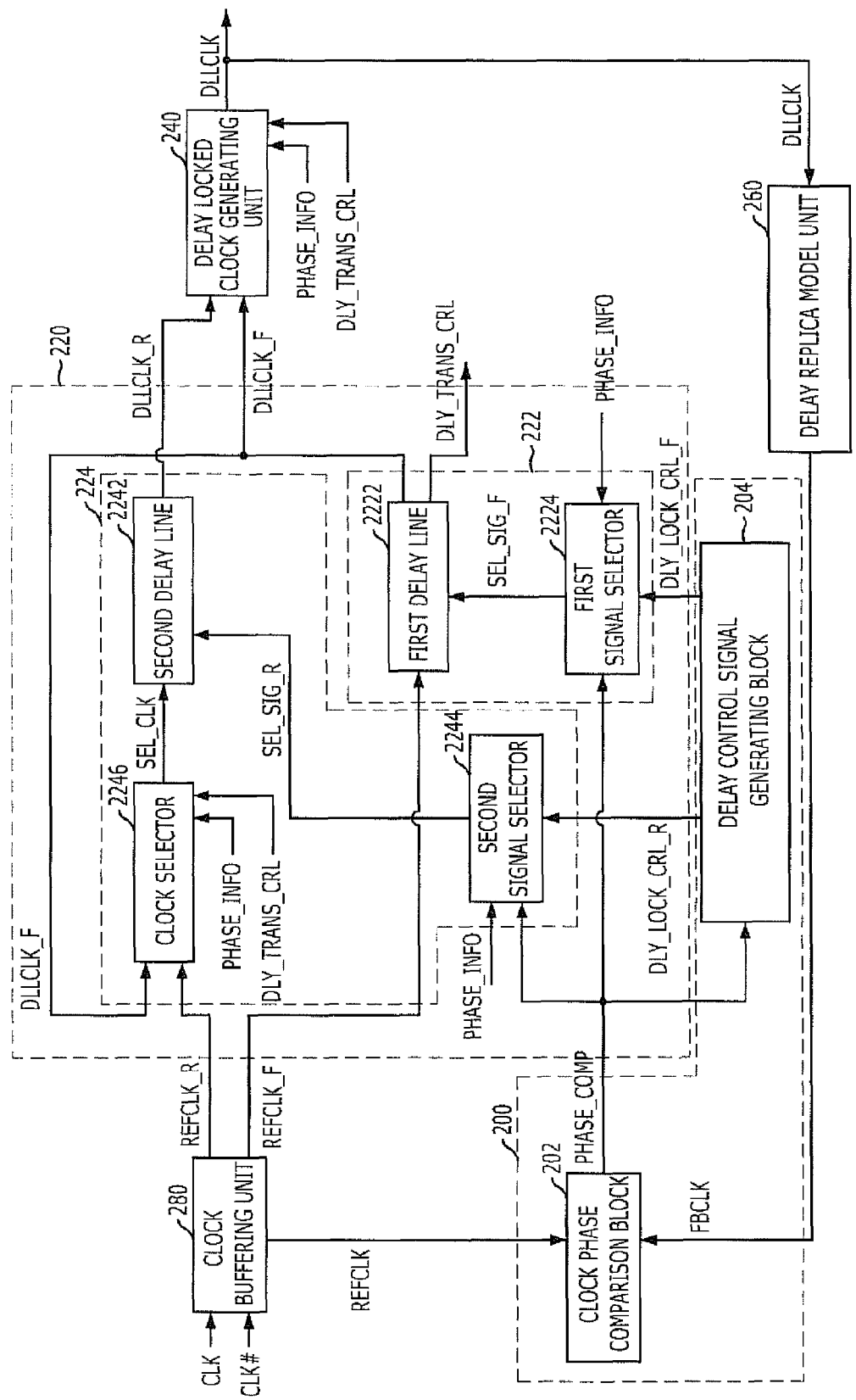
FIG. 2 is a block diagram illustrating a register controlled DLL circuit in accordance with an embodiment of the present invention.

FIG. 2 is a block diagram illustrating a register controlled DLL circuit in accordance with an embodiment of the present invention.

As shown in FIG. 2, a register controlled DLL circuit in accordance with an embodiment of the present invention includes a phase comparison unit 200, a lock delay unit 220, a delay locked clock generating unit 240, and a delay replica model unit 260.

The phase comparison unit 200 compares a phase of a reference clock REFCLK with a phase of a feedback clock FBCLK, and includes a clock phase comparison block 202 and a delay control signal generating block 204.

The clock phase comparison block 202 compares the phase of the reference clock REFCLK and the phase of the feedback clock FBCLK, and generates a phase comparison signal PHASE_COMP having a logic level determined according to a comparison result.

If the reference clock REFCLK leads the feedback clock FBCLK (that is, a reference edge of the reference clock REFCLK is prior to a reference edge of the feedback clock FBCLK), the phase comparison signal PHASE_COMP having a logic low level is outputted, indicating an inactive state. If the reference clock REFCLK lags the feedback clock FBCLK (that is, a reference edge of the feedback clock FBCLK is prior to a reference edge of the reference REFCLK), the phase comparison signal PHASE_COMP having a logic high level is outputted, indicating an active state.

The delay control signal generating block 204 classifies the phase comparison signal PHASE_COMP at a predetermined period using a predetermined pattern, and outputs first and second delay control signal DLY_CLOCK_CRL_F and DLY_LOCK_CRL_R as classified phase comparison signals.

The delay control signal generating block 204 outputs a first delay control signal DLY_LOCK_CRL_F, which is the phase comparison signal PHASE_COMP classified at an odd period from a start point of the phase comparison performed by the clock phase comparison block 202. The delay control signal generating block 204 also outputs a second delay control signal DLY_LOCK_CRL_R, which is the phase comparison signal PHASE_COMP classified at an even period from the start point of the phase comparison performed by the clock comparison block 202.

The clock delay unit 220 delays the first reference clock REFCLK_F through a first delay line 2222 by a delay amount corresponding to the first delay control signal DLY_LOCK_CRL_F outputted from the phase comparison unit 200, outputs a first delay locked clock DLLCLK_F as a delayed clock of the first reference clock REFCLK_F, and outputs a delay transfer signal DLY_TRANS_CRL when the delay amount reaches a limited delay amount.

The clock delay unit 220 delays one of the second reference clock REFCLK_R and the first delay locked clock DLLCLK_F by a delay amount according to the delay transfer signal DLY_TRANS_CRL and the second delay control signal DLY_LOCK_CRL_R outputted from the phase comparison unit 220 in response to a frequency information signal PHASE_INFO, and outputs a second delay locked clock DLLCLK_R as a delayed clock of one of the second reference clock REFCLK_R and the first delay locked clock DLLCLK_F.

The clock delay unit 220 includes a first clock delay block 222 and a second cock delay block 224.

The first clock delay block 222 delays the first reference clock REFCLK_F by the delay amount corresponding to one of the first delay control signal DLY_LOCK_CRL_F and the phase comparison signal PHASE_COMP in response to the frequency information signal PHASE_INFO, and outputs the first delay locked clock DLLCLK_F as a delayed clock of the first reference clock REFCLK_F. Further, the first clock delay block 222 activates the delay transfer signal DLY_TRANS_CRL to a logic high level when the delay amount reaches a limited delay amount.

When the frequency information signal PHASE_COMP has high frequency operating mode information, the first clock delay block 222 delays the first reference clock REFCLK_F by the delay amount according to the first delay control signal DLY_LOCK_CRL_F outputted from the delay control signal generating block 204, and outputs the first delay locked clock DLLCLK_F as a delayed clock of the first reference clock REFCLK_F.

When the frequency information signal PHASE_COMP has low frequency operating mode information, the first clock delay block 222 delays the first reference clock REFCLK_F by the delay amount according to the phase comparison signal PHASE_COMP outputted from the clock phase comparison block 202, and outputs the first delay locked clock DLLCLK_F as a delayed clock of the first reference clock REFCLK_F.

The first clock delay block 222 includes a first signal selector 2224 and a first delay line 2222.

The first signal selector 2224 selectively outputs the phase comparison signal PHASE_COMP outputted from the clock phase comparison block 202 and the first delay control signal DLY_LOCK_CRL_F outputted from the delay control signal generating block 204 in response to the frequency information signal PHASE_INFO.

The first signal selector 2224 selects and outputs the phase comparison signal PHASE_COMP during the high frequency operating mode where the frequency information signal PHASE_INFO has a logic low level (i.e., where it is inactive), and selects and outputs the first delay control signal DLY_LOCK_CTR_F during the low frequency operating mode where the frequency information signal PHASE_INFO has a logic high level (i.e., where it is active).

The first delay line 2222 delays the first reference clock REFCLK_F by a delay amount according to an output signal SEL_SIG_F of the first signal selector 2224, and outputs the first delay locked clock DLLCLK_F as a delayed clock of the first reference clock REFCLK_F. The first delay line 2222 activates the delay transfer signal DLY_TRANS_CRL to a logic high level in response to a limited delay amount.

The first delay line 2222 delays the first reference clock REFCLK_F by an increased delay amount in response to the output signal SEL_SIG_F of the first signal selector 2224, which is activated to a logic high level, and outputs the first delay locked clock DLLCLK_F as a delayed clock of the first reference clock REFCLK_F. The first delay line 2222 delays the first reference clock REFCLK_F by a decreased delay amount in response to the output signal SEL_SIG_F of the first signal selector 2224, which is inactivated to a logic low level, and outputs the first delay locked clock DLLCLK_F as a delayed clock of the first reference clock REFCLK_F.

Meanwhile, in a case of a high frequency operating mode, the second clock delay block 224 delays the second reference clock REFCLK_R by the delay amount corresponding to the second delay control signal DLY_LOCK_CRL_R, and outputs the second delay locked clock DLLCLK_R as a delayed second reference clock REFCLK_R.

In a case of a low frequency operating mode, after the delay control signal DLY_TRANS_CRL is activated to a logic high level, the second clock delay block 224 delays the first delay locked clock DLLCLK_F by a delay amount corresponding to the phase comparison signal PHASE_COMP outputted from the clock phase comparison block 202, and outputs the second delay locked clock DLLCLK_R as a delayed clock of the first delay locked clock DLLCLK_F.

The second clock delay block 224 includes a second signal selector 2244, a clock selector 2246, and a second delay line 2242.

The second signal selector 2244 selectively outputs the phase comparison signal PHASE_COMP outputted from the clock phase comparison block 202 and the second delay control signal DLY_LOCK_CRL_R in response to the frequency information signal PHASE_INFO.

The second signal selector 2244 selects and outputs the phase comparison signal PHASE_COMP during the high frequency operating mode where the frequency information signal PHASE_INFO has a logic low level (i.e., where PHASE_INFO is inactive).

The second signal selector 2244 selects and outputs the second delay control signal DLY_LOCK_CRL_R during the low frequency operating mode where the frequency information signal PHASE_INFO has a logic high level (i.e., where PHASE_INFO is active).

The clock selector 2246 outputs one of the second reference clock REFCLK_R, the first delay locked clock DLLCLK_F, and a locked signal having a predetermined logic level in response to the frequency information signal PHASE_INFO and the delay transfer signal DLY_TRANS_CRL.

The clock selector 2246 selects and outputs the second reference clock REFCLK_R irrespective of a logic level of the delay transfer signal DLY_TRANS_CRL during a high frequency operating mode where the frequency information signal PHASE_INFO has a logic low level (i.e., where PHASE_INFO is inactive).

The clock selector 2246 selects and outputs the first delay locked clock DLLCLK_F where the delay transfer signal DLY_TRANS_CRL which is activated to a logic high level during the low frequency operation where the frequency information signal PHASE_INFO has a logic high level (i.e., where PHASE_INFO is active).

The clock selector 2246 selects and outputs the locked signal having the predetermined logic level in response to the delay transfer signal DLY_TRANS_CRL having a logic low level (i.e., DLY_TRANS_CRL is inactive).

The second delay line 2242 delays an output clock SEL_CLK of the clock selector 2246 by a delay amount according to the output signal SEL_SIG_R of the second signal selector 2244, and outputs the second delay locked clock DLLCLK_R as a delayed clock of the output clock SEL_CLK of the clock selector 2246.

The second delay line 2242 delays the output clock SEL_CLK of the clock selector 2246 by a decreased delay amount in response to the output signal SEL_SIG_R of the second signal selector 2244, which is inactivated to a logic low level.

The delay locked clock generating unit 240 outputs a phase-mixed clock of the first delay locked clock DLLCLK_F and the second delay locked clock DLLCLK_R in response to the frequency information signal PHASE_INFO and the delay transfer signal DLY_TRANS_CRL.

Further, the delay locked clock generating unit 240 outputs the delay locked clock DLLCLK as one of the first delay locked clock DLLCLK_F and the second delay locked clock DLLCLK_R.

In the case of a high frequency operating mode, where the frequency information signal PHASE_INFO has a logic high level, the delay locked clock generating unit 240 outputs the delay locked clock DLLCLK as a phase-mixed clock of the first delay locked clock DLLCLK_F and the second delay locked clock DLLCLK_R irrespective of the logic level of the delay transfer signal DLY_TRANS_CRL.

In the case of a low frequency operating mode, where the frequency information signal PHASE_INFO has a logic low level, the delay locked clock generating unit 240 outputs the delay locked clock DLLCLK as the first delay locked clock DLLCLK_F in response to the delay transfer signal DLY_TRANS_CRL which is inactivated to the logic low level when the delay amount of the first delay line 222 does not reach the limited delay amount. Also in the case of a low frequency operating mode, the delay locked clock generating unit 240 outputs the delay locked clock DLLCLK as the second delay locked clock DLLCLK_R in response to the delay transfer signal DLY_TRANS_CRL which is activated to the logic high level when the delay amount of the first delay line 222 reaches the limited delay amount.

The delay replica model unit 260 reflects a real delay condition of the reference clock REFCLK on the delay locked clock DLLCLK, and outputs the feedback clock FBCLK.

As shown in FIG. 2, a register controlled DLL circuit in accordance with an embodiment of the present invention further includes a clock buffering unit 280 for buffering an external clock CLK and an inverted external clock CLK#, and generates the reference clock REFCLK, the first reference clock REFCLK_F corresponding to a first edge of the reference clock REFCLK, and the second reference clock REFCLK_R corresponding to a second edge of the reference clock REFCLK.

Further, a register controlled DLL circuit in accordance with another embodiment of the present invention may further include a frequency information signal generating unit (not shown) for detecting an operating frequency of a semiconductor device and generating the frequency information signal PHASE_INFO of which a logic level is variable depending upon a detection result.

The frequency information signal generating unit generates the frequency information signal PHASE_INFO, which is activated to a logic high level when the operating frequency of a semiconductor device is higher than a predetermined frequency. Similarly, the frequency information signal generating unit generates the frequency information signal PHASE_INFO, which is inactivated to a logic low level when the operating frequency of the semiconductor device is lower than a predetermined frequency.

Moreover, a register controlled DLL circuit in accordance with another embodiment of the present invention may further include a frequency information signal input unit (not shown) for receiving the frequency information signal PHASE_INFO of which a logic level is variable depending upon the operating frequency.

The frequency information signal input unit receives the frequency information signal PHASE_INFO, which is activated to a logic high level when the operating frequency of a semiconductor device is higher than a predetermined frequency. Also, the frequency information signal input unit receives the frequency information signal PHASE_INFO, which is inactivated to a logic low level when the operating frequency of the semiconductor device is lower than a predetermined frequency.

That is, the frequency information signal PHASE_INFO having a logic level corresponding to the operating frequency of the semiconductor device is generated from an external signal of the semiconductor device.

Further, a logic level of the phase information signal PHASE_INFO may be changed depending upon a column latency value determined by a Memory Register Set (MRS) which is separately installed from a DLL circuit in a semiconductor device.

That is, the column latency value determined by the MRS determines a system clock period at which data is outputted to the semiconductor device after the column address is applied to the semiconductor device.

Accordingly, a large column latency value represents that a high frequency is used in the semiconductor device, and a small column latency value represents that a low frequency is used in the semiconductor device.

For example, if the column latency value is smaller than five, the logic level of the frequency information signal PHASE_INFO is set to a logic low level. If the column latency value is larger than five, the logic level of the frequency information signal PHASE_INFO is set to a logic high level.

Hereinafter, an operation of the clock delay unit 220 of the register controlled DLL circuit shown in FIG. 2 in accordance with an embodiment of the present invention will be described as follows.

If the semiconductor device operates at a high frequency operation based on the frequency information signal PHASE_INFO, the clock delay unit 220 increases a delay amount of the first reference clock REFCLK_F and outputs the first delay locked clock DLLCLK_F as a delayed clock of the first reference clock REFCLK_F by increasing a delay amount of the first delay line 2222 in response to the first delay control signal DLY_CLOCK_CRL_F, which is activated to the logic high level. And, the clock delay unit 220 decreases a delay amount of the first reference clock REFCLK_F and outputs the first delay locked clock DLLCLK_F as a delayed clock of the first reference clock REFCLK_F by decreasing a delay amount of the first delay line 2222 in response to the first delay control signal DLY_CLOCK_CRL_F, which is inactivated to the logic low level.

If the semiconductor device operates at a low frequency based on the frequency information signal PHASE_INFO, the clock delay unit 220 increases a delay amount of the first reference clock REFCLK_F and outputs the first delay locked clock DLLCLK_F as a delayed clock of the to first reference clock REFCLK_F by increasing a delay amount of the first delay line 2222 in response to the phase comparison signal PHASE_COMP, which is activated to the logic high level. And, the clock delay unit 220 decreases a delay amount of the first reference clock REFCLK_F and outputs the first delay locked clock DLLCLK_F as a delayed clock of the first reference clock REFCLK_F by decreasing a delay amount of the first delay line 2222 in response to the phase comparison signal PHASE_COMP, which is inactivated to the logic low level.

That is, a delay amount adjustment of the first delay line 2222 is determined by increasing or decreasing a time for which the first reference clock REFCLK_F passes through the first delay line 222 irrespective of a low frequency operating mode or a high frequency operating mode.

In the case of a low frequency operating mode corresponding to the frequency information signal PHASE_INFO, the clock delay unit 220 adjusts a delay amount of the first delay line in response to the phase comparison signal PHASE_COMP directly outputted from the clock phase comparison block 202. And, in the case of a high frequency operating mode corresponding to the frequency information signal PHASE_INFO, the clock delay unit 220 adjusts a delay amount of the first delay line in response to the first delay control signal DLY_CLOCK_CRL_F outputted from the delay control signal generating block 204.

In the case of the high frequency operating mode corresponding to the frequency information signal PHASE_INFO, the clock delay unit 220 increases a delay amount of the second reference clock REFCLK_R and outputs the second delay locked clock DLLCLK_R, as a delayed clock of the second reference clock REFCLK_R, by increasing a delay amount of the second delay line 2242 in response to the second delay control signal DLY_LOCK_CRL_R, which is activated to a logic high level. The clock delay unit 220 decreases a delay amount of the second reference clock REFCLK_R and outputs the second delay locked clock DLLCLK_R, as a delayed clock of the second reference clock REFCLK_R, by decreasing a delay amount of the second delay line 2242 in response to the second delay control signal DLY_LOCK_CRL_R, which is inactivated to a logic low level.

In the case of the low frequency operating mode corresponding to the frequency information signal PHASE_INFO, after the delay transfer signal DLY_TRANS_CRL is activated to a logic high level when the delay amount of the first delay line 2222 reaches a limited delay amount, the clock delay unit 220 increases a delay amount of the first delay locked clock DLLCLK_F and outputs the second delay locked clock DLLCLK_R, as a delayed clock of the first delay locked clock DLLCLK_F, by increasing a delay amount of the second delay line 2242 in response to the phase comparison signal PHASE_COMP, which is activated to a logic high level. The clock delay unit 220 decreases a delay amount of the first delay locked clock DLLCLK_F and outputs the second delay locked clock DLLCLK_R, as a delayed clock of the first delay locked clock DLLCLK_F, by decreasing a delay amount of the second delay line 2242 in response to the phase comparison signal PHASE_COMP, which is inactivated to a logic low level.

That is, in case of the low frequency operating mode corresponding to the frequency information signal PHASE_INFO, the delay operation of the reference clock REFCLK is performed by first using a delay amount of the first delay line 2222 in response to the comparison signal PHASE_COMP, and then, by delaying the delay amount of the second delay line 2242.

In more detail, the first reference clock REFCLK_F is delayed by the delay amount of the first delay line 2222 in response to the phase comparison signal PHASE_COMP. If a delayed locked operation is not terminated after the delay amount of the first delay line 222 reaches a limited delay amount, the first delay locked clock DLLCLK_F outputted from the first delay line 2222 is further delayed by the delay amount of the second delay line 2242, and is outputted as the second delay locked clock DLLCLK_R.

That is, the first reference clock REFCLK_F applied to the first delay line 2222 is delayed by the sum of the delay amount of the first delay line 2222 and the delay amount of the second delay line 2242, and is outputted as the second delay locked clock DLLCLK_R. In this case, the second delay locked clock DLLCLK_R is outputted as a final clock through the delay locked operation.

However, in the case of the high frequency operating mode corresponding to the frequency information signal PHASE_INFO, the first reference clock REFCLK_F is delayed by the delay amount of the first delay line 2222 in response to the first delay control signal DLY_LOCK_CRL_F, and the second reference clock REFCLK_R is delayed by the delay amount of the second delay line 2242 in response to the second delay control signal DLY_LOCK_CRL_R.

In more detail, the first delay line 2222 delays the first reference clock REFCLK_F in response to the first delay control signal DLY_LOCK_CRL_F. The second delay line 2242 delays the second reference clock REFCLK_R in response to the second delay control signal DLY_LOCK_CRL_R. The operation times of the first delay line 2222 and the second delay line 2242 overlap.

That is, the first reference clock REFCLK_F applied to the first delay line 2222 is delayed by the delay amount of the first delay line 2222, and is outputted as the first delay locked clock DLLCLK_F. The second reference clock REFCLK_R applied to the second delay line 2242 is delayed by the delay amount of the second delay line 2242, and is outputted as the second delay locked clock DLLCLK_R. In this case, the first delay locked clock DLLCLK_F and the second delay locked clock DLLCLK_R are outputted as final clocks through the delay locked operation.

If a delayed locked operation is not terminated after the delay amount of the first delay line 222 reaches a limited delay amount, the first delay locked clock DLLCLK_F outputted from the first delay line 2222 is further delayed by the delay amount of the second delay line 2242, and is outputted as the second delay locked clock DLLCLK_R.

That is, the first reference clock REFCLK_F applied to the first delay line 2222 is delayed by the sum of the delay amount of the first delay line 2222 and the delay amount of the second delay line 2242, and is outputted as the second delay locked clock DLLCLK_R. In this case, the second delay locked clock DLLCLK_R is a final clock outputted by the delay locked operation.

As described above, where the external clock CLK and the inverted external clock CLK# of the external clock have high frequencies, the register controlled DLL circuit in accordance with an embodiment of the present invention performs a duty correction operation and improves the accuracy of the delay locked operation by delaying the first reference clock REFCLK_F, corresponding to the first edge of the reference clock REFCLK, and the second reference clock REFCLK_R, corresponding to the second edge of the reference clock REFCLK.

On the contrary, where the external clock CLK and the inverted external clock CLK# of the external clock have low frequencies, the register controlled DLL circuit in accordance with an embodiment of the present invention obtains a large delay margin of the delay locked operation by delaying the first reference clock REFCLK_F, corresponding to the first edge of the reference clock.

Accordingly, if the external clock CLK and the inverted external clock CLK# have high frequencies, a current amount consumed by the delay locked operation is decreased. If the external clock CLK and the inverted external clock CLK# have low frequencies, an area of a DLL circuit for the delay locked operation is decreased.

That is, the register controlled DLL circuit in accordance with an embodiment of the present invention decreases a current amount consumed by the delay locked operation where the external clock has a high frequency, and decreases an area of a DLL circuit for a delay locked operation where the external clock has a low frequency by changing a manner of delaying the reference clock based on the frequency of the external clock.

While the present invention has been described with respect to the specific embodiments, it will be apparent to those skilled in the art that various changes and modifications may be made without departing from the spirit and scope of the invention as defined in the following claims.

For example, although it is assumed that the first edge of the reference clock REFCLK is a falling edge and the second edge of the reference clock REFCLK is a rising edge in the embodiment of the present invention as described above, the scope of the present invention includes the opposite case (i.e., where the first edge is a rising edge and the second edge is a falling edge).

What is claimed is:

1. A delay locked loop (DLL) circuit, comprising:
   a phase comparison unit configured to compare a reference clock with a feedback clock and to output a phase comparison signal;
   a clock delay unit configured to delay a first reference clock in response to the phase comparison signal, to output a first delay locked clock, to delay one of the first delay locked clock and a second reference clock according to a frequency information signal, and to output a second delay locked clock;
   a delay locked clock generating unit configured to output a delay locked clock as a phase-mixed clock of the first delay locked clock and the second delay locked clock, the first delay locked clock, or the second delay locked clock in response to the frequency information signal and a delay transfer signal; and
   a delay replica model unit configured to reflect a delay condition of the reference clock on the delay locked clock and to output the feedback clock.

2. The DLL circuit of claim 1, wherein the first reference clock corresponds to a first edge of the reference clock, the second reference clock corresponds to a second edge of the reference clock, and the delay transfer signal is activated when a delay amount reaches a limited delay amount.

3. The DLL circuit of claim 1, wherein the phase comparison unit includes:
   a clock phase comparison block configured to compare a phase of the reference clock and a phase of the feedback clock, and generate the phase comparison signal of which a logic level is determined based upon a comparison result; and
   a delay control signal generating block configured to classify the phase comparison signal at a predetermined period using a predetermined pattern, and to output a first delay control signal and a second delay control signal.

4. The DLL circuit of claim 3, wherein the clock phase comparison block compares the phase of the reference clock with the phase of the feedback clock, outputs the phase comparison signal in an inactive state if the reference clock leads the feedback clock, and outputs the phase comparison signal in an active state if the feedback clock leads the reference clock.

5. The DLL circuit of claim 3, wherein the delay control signal generating block outputs the first delay control signal as the phase comparison signal classified at a predetermined odd period from a start point of a phase comparison, and outputs the second delay control signal as the phase comparison signal classified at a predetermined even period from the start point of the phase comparison.

6. The DLL circuit of claim 5, wherein in case of a high frequency operating mode corresponding to the frequency information signal, the clock delay unit increases a delay amount of the first reference clock and outputs the first delay locked clock by increasing a delay amount of a first delay line in response to an active state of the first delay control signal, and decreases a delay amount of the first reference clock and outputs the first delay locked clock by decreasing the delay amount of the first delay line in response to an inactive state of the first delay control signal.

7. The DLL circuit of claim 6, wherein in case of a low frequency operating mode corresponding to the frequency information signal, the clock delay unit increases the delay amount of the first reference clock and outputs the first delay locked clock by increasing the delay amount of the first delay line in response to an active state of the phase comparison signal, and decreases the delay amount of the first reference clock and outputs the first delay locked clock by decreasing the delay amount of the first delay line in response to an inactive state of the phase comparison signal.

8. The DLL circuit of claim 7, wherein in case of a high frequency operating mode corresponding to the frequency information signal, the clock delay unit increases a delay amount of the second reference clock and outputs the second delay locked clock by increasing a delay amount of a second delay line in response to an active state of the second delay control signal, and decreases the delay amount of the second reference clock and outputs the second delay locked clock by decreasing the delay amount of the second delay line in response to an inactive state of the second delay control signal.

9. The DLL circuit of claim 8, wherein in case of a low frequency operating mode corresponding to the frequency information signal, after the delay transfer signal is activated when the delay amount of the first delay line reaches a limited delay amount, the clock delay unit increases a delay amount of the first delay locked clock and outputs the second delay locked clock by increasing the delay amount of the second delay line in response to an active state of the phase comparison signal, and decreases the delay amount of the first delay locked clock and outputs the second delay locked clock by decreasing the delay amount of the second delay line in response to an inactive state of the phase comparison signal.

10. The DLL circuit of claim 9, wherein in case of a high frequency operating mode corresponding to the frequency information signal, the delay locked clock generating unit outputs the delay locked clock as a phase-mixed clock of the first delay locked clock and the second delay locked clock irrespective of a logic level of the delay transfer signal.

11. The DLL circuit of claim 10, wherein in case of a low frequency operating mode corresponding to the frequency information signal, the delay locked clock generating unit outputs the delay locked clock as the first delay locked clock in response to an inactive state of the delay transfer signal when the delay amount of the first delay line does not reach the limited delay amount, and outputs the delay locked clock as the second delay locked clock in response to an active state of the delay transfer signal when the delay amount of the first delay line reaches the limited delay amount.

12. The DLL circuit of claim 1, further comprising:
a buffering unit configured to buffer an external clock and an inverted external clock, and to generate the reference clock, the first reference clock, and the second reference clock.

13. The DLL circuit of claim 1, further comprising:
a frequency information signal generating unit configured to detect an operating frequency, and to generate the frequency information signal of which a logic level is variable depending upon a detection result.

14. The DLL circuit of claim 1, further comprising:
a frequency information signal input unit configured to receive the frequency information signal of which a logic level is variable depending upon an operating frequency from an external signal.

15. The DLL circuit of claim 1, wherein a logic level of the frequency information signal is variable depending upon a column latency value determined by a memory register set (MRS).

16. A delay locked loop (DLL) circuit, comprising:
a phase comparison unit configured to compare a reference clock with a feedback clock and to output a phase comparison signal;
a delay control signal generating unit configured to classify the phase comparison signal at a predetermined period using a predetermined pattern, and to output a first delay control signal and a second delay control signal;
a first clock delay unit configured to output a first delay locked clock as a delayed clock of a first reference clock in response to the first delay control signal during a high frequency operating mode, to output the first delay locked clock as the delayed clock of the first reference clock in response to the phase comparison signal outputted from the phase comparison unit, and to activate a delay transfer signal in response to a delay amount which reaches a limited delay amount;
a second clock delay unit configured to output a second delay locked clock as a delayed clock of a second reference clock in response to the second delay control signal during the high frequency operating mode, and to output the second delay locked clock as one of the first and second delay locked clocks corresponding to the delay transfer signal during the low frequency operating mode;
a clock delay unit configured to delay the first reference clock in response to the phase comparison signal, to output the first delay locked clock, to delay one of the first delay locked clock and the second reference clock corresponding to a frequency information signal, and to output the second delay locked clock;
a delay locked clock generating unit configured to output a delay locked clock as a phase-mixed clock of the first delay locked clock and the second delay locked clock during a high frequency operating mode, and to output the delay locked clock as one of the first delay locked clock and the second delay locked clock during a low frequency operating mode; and
a delay replica model unit configured to reflect a delay condition of the reference clock on the delay locked clock and to output the feedback clock.

17. The DLL circuit of claim 16, wherein the phase comparison unit compares the phase of the reference clock with the phase of the feedback clock, outputs the phase comparison signal in an inactive state if the reference clock leads the feedback clock, and outputs the phase comparison signal in an active state if the feedback clock leads the reference clock.

18. The DLL circuit of claim 17, wherein the delay control signal generating unit outputs a first delay control signal as the phase comparison signal which is classified at a predetermined odd period from a start point of a phase comparison, and outputs a second delay control signal as the phase comparison signal which is classified at a predetermined even period from the start point of the phase comparison.

19. The DLL circuit of claim 18, wherein the first clock delay unit includes:
a first signal selector configured to selectively output the phase comparison signal and the first delay control signal in response to the frequency information signal; and
a first delay line configured to delay the first reference clock by a delay amount corresponding to an output of the first signal selector, to output the first delay locked clock as a delayed clock of the first reference clock, and to activate the delay transfer signal in response to the delay amount which reaches a limited delay amount.

20. The DLL circuit of claim 19, wherein the first signal selector selects and outputs the phase comparison signal in response to the frequency information signal inactivated during the high frequency operating mode, and selects and outputs the first delay control signal in response to the frequency information signal activated during the low frequency operating mode.

21. The DLL circuit of claim 19, wherein the first delay line delays the first reference clock by an increased delay amount in response to the output signal of the first signal selector being activated or delays the first reference clock by a decreased delay amount in response to the output signal of the first selector being inactivated, and outputs the first delay locked clock as a delayed clock of the first reference clock.

22. The DLL circuit of claim 19, wherein the second clock delay unit includes:
- a second signal selector configured to selectively output the phase comparison signal and the second delay control signal in response to the frequency information signal;
- a clock selector configured to output one of the second reference clock, the first delay locked clock, and a locked clock having a predetermined logic level in response to the frequency information signal and the delay transfer signal; and
- a second delay line configured to delay an output of the clock selector by a delay amount corresponding to an output signal of the second signal selector, and to output the second delay locked clock as a delayed clock of the output of the clock selector.

23. The DLL circuit of claim 22, wherein the second signal selector selects and outputs the phase comparison signal in response to the frequency information signal being inactivated during the high frequency operating mode, and selects and outputs the second delay control signal in response to the frequency information signal being activated during the low frequency operating mode.

24. The DLL circuit of claim 22, wherein the clock selector selects and outputs the second reference clock irrespective of a logic level of the delay transfer signal when the frequency information signal is inactivated during the high frequency operating mode.

25. The DLL circuit of claim 24, wherein the clock selector selects and outputs the first delay locked clock in response to the delay transfer signal being activated, and selects and outputs a locked clock having a predetermined logic level in response to the delay transfer signal being inactivated during the low frequency operating mode.

26. The DLL circuit of claim 22, wherein the second delay line delays the output signal of the clock selector by an increased delay amount in response to the output signal of the second signal selector being activated or delays the output signal of the clock selector by a decreased delay amount in response to the output signal of the second signal selector being inactivated, and outputs the second delay locked clock as a delayed clock of the output signal of the clock selector.

27. The DLL circuit of claim 16, wherein the delay locked clock generating unit outputs the delay locked clock as a phase-mixed clock of the first delay locked clock and the second delay locked clock during the high frequency operating mode, outputs the delay locked clock as the first delay locked clock in response to the delay transfer signal being inactivated when the delay amount does not reach a limited delay amount of the first clock delay unit during the low frequency operating mode, and outputs the delay locked clock as the second delay locked clock in response to the delay transfer signal being activated during the low frequency operating mode when the delay amount reaches the limited delay amount of the first clock delay unit.

28. The DLL circuit of claim 16, further comprising:
- a buffering unit configured to buffer an external clock and an inverted external clock, and to generate the reference clock, the first reference clock, and the second reference clock.

29. The DLL circuit of claim 16, further comprising:
- a frequency information signal generating unit configured to detect an operating frequency, and to generate the frequency information signal of which a logic level is variable depending upon a detection result.

30. The DLL circuit of claim 16, further comprising:
- a frequency information signal input unit configured to receive the frequency information signal of which a logic level is variable depending upon an operating frequency from an external signal.

31. The DLL circuit of claim 16, wherein a logic level of the frequency information signal is variable depending upon a column latency value determined by a memory register set (MRS).

* * * * *